(12) United States Patent
Takaya et al.

(10) Patent No.: US 9,281,396 B2
(45) Date of Patent: Mar. 8, 2016

(54) SEMICONDUCTOR DEVICE

(71) Applicants: Hidefumi Takaya, Toyota (JP);
Katsuhiro Kutsuki, Nagoya (JP)

(72) Inventors: Hidefumi Takaya, Toyota (JP);
Katsuhiro Kutsuki, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/505,159

(22) Filed: Oct. 2, 2014

(65) Prior Publication Data

US 2015/0129957 A1    May 14, 2015

(30) Foreign Application Priority Data

Nov. 12, 2013  (JP) ................. 2013-234341

(51) Int. Cl.
  *H01L 29/78*  (2006.01)
  *H01L 29/423*  (2006.01)

(52) U.S. Cl.
  CPC ........ *H01L 29/7827* (2013.01); *H01L 29/4236* (2013.01); *H01L 29/7811* (2013.01); *H01L 29/7813* (2013.01)

(58) Field of Classification Search
  IPC ...................... H01L 29/4236,29/7811
  See application file for complete search history.

(56) References Cited

U.S. PATENT DOCUMENTS

| | | | | |
|---|---|---|---|---|
| 7,569,875 | B2 * | 8/2009 | Suzuki et al. | 257/287 |
| 7,586,151 | B2 * | 9/2009 | Takaya et al. | 257/330 |
| 7,999,312 | B2 * | 8/2011 | Takaya et al. | 257/331 |
| 2006/0081919 | A1 | 4/2006 | Inoue et al. | |
| 2006/0289928 | A1 | 12/2006 | Takaya et al. | |
| 2007/0029543 | A1 | 2/2007 | Ninomiya et al. | |
| 2010/0155879 | A1 * | 6/2010 | Schulze et al. | 257/503 |

FOREIGN PATENT DOCUMENTS

| | | |
|---|---|---|
| JP | A-2005-116822 | 4/2005 |
| JP | A-2006-120789 | 5/2006 |
| JP | A-2007-42954 | 2/2007 |
| JP | A-2008-135522 | 6/2008 |

* cited by examiner

*Primary Examiner* — Eugene Lee
(74) *Attorney, Agent, or Firm* — Oliff PLC

(57) ABSTRACT

A trench structure which is capable of promoting extension of a depletion layer and hardly causes thermal stress is provided. A semiconductor device includes a semiconductor substrate. A plurality of loop trenches is formed on the surface of the semiconductor substrate. Each loop trench is configured to extend so as to surround a region smaller than the region where a plurality of gate trenches is formed. Each loop trench is separated from other loop trenches. A second insulating layer is located in each loop trench. P-type fourth regions are formed in the semiconductor substrate. Each fourth region is in contact with a bottom surface of corresponding one of the loop trenches and is configured to extend along the corresponding one of the loop trenches.

6 Claims, 16 Drawing Sheets

SEMICONDUCTOR DEVICE

CROSS-REFERENCE TO RELATED APPLICATION

This application claims priority to Japanese Patent Application No. 2013-234341 filed on Nov. 12, 2013, the contents of which are hereby incorporated by reference into the present application.

TECHNICAL FIELD

A technology disclosed in this description relates to a semiconductor device.

DESCRIPTION OF RELATED ART

The semiconductor device disclosed in Japanese Patent Application Publication No. 2005-116822 has a MOSFET and a plurality of outer peripheral trenches formed on a periphery of the MOSFET. Each of the outer peripheral trenches extends in a loop so as to surround a region in which the MOSFET is formed. An insulating layer is disposed in each of the outer peripheral trenches. Moreover, a p-type floating region is formed in a semiconductor layer in a range in contact with a bottom surface of each of the outer peripheral trenches. When the MOSFET is turned off, a depletion layer extends from a body region of the MOSFET toward a circumference side (a region in which the outer peripheral trenches are formed). When the depletion layer extends to the p-type floating region located under the innermost outer peripheral trench, the depletion layer further extends from that p-type floating region toward the outer circumference side. When the depletion layer extends to the adjacent p-type floating region in such a manner, the depletion layer further extends to the outer circumference side from that p-type floating region. As described above, the depletion layer widely spreads to the periphery of the region in which the MOSFET is formed while going through each of the p-type floating regions. As a result, a withstand voltage of the semiconductor device is improved.

SUMMARY

The outer peripheral trench in Japanese Patent Application Publication No. 2005-116822 extends long so as to surround the entire region in which the MOSFET is formed. Thus, high thermal stress can easily apply to the outer peripheral trench, which is a problem.

A semiconductor device disclosed herein comprises a semiconductor substrate. An n-type first region is formed in the semiconductor substrate and in a range exposed to a front surface of the semiconductor substrate. A p-type second region is formed in the semiconductor substrate, in a range exposed to the front surface and in a range located under the first region, and is in contact with the first region. An n-type third region is formed in the semiconductor substrate and in a range located under the second region, and is in contact with the second region and separated from the first region by the second region. A plurality of gate trenches is formed on the front surface and is configured to penetrate the first and second regions and reach the third region. A first insulating layer and a gate electrode are formed in each gate trench, and the gate electrode is configured to face the second region via the first insulating layer. A plurality of loop trenches is formed in a peripheral region of the front surface, which the peripheral region is located between a gate trench region in which the plurality of gate trenches is formed and an end surface of the semiconductor substrate, and the plurality of loop trenches is configured to penetrate the second region and reach the third region. Each loop trench is configured, when the semiconductor substrate is viewed from a front surface side, to extend so as to surround a region smaller than the gate trench region. Each loop trench is separated from other loop trenches. A second insulating layer is located in each loop trench. A plurality of p-type fourth regions is formed in the semiconductor substrate, and each fourth region is in contact with a bottom surface of corresponding one of the loop trenches and is configured to extend along the corresponding one of the loop trenches.

In this semiconductor device, the plurality of loop trenches is formed in the peripheral region, and the p-type fourth region is formed in the range in contact with the bottom surface of each of the loop trenches. Each of the fourth regions promotes extension of a depletion layer from a MOS structure toward the peripheral region when the MOS structure, having the first region, the second region, the third region, and the gate trench, is off. As a result, a withstand voltage of the semiconductor device is improved. Moreover, each of the loop trenches extends so as to surround the region smaller than the gate trench region in which the plurality of gate trenches is formed. Moreover, each of the loop trenches is separated from the other loop trenches. Since each of the loop trenches is finely separated as above, even if a temperature of the semiconductor device rises, thermal stress generated in each of the loop trenches is suppressed.

DETAILED DESCRIPTION

Some additional aspects of the disclosure herein will be described. In the semiconductor device disclosed in Japanese Patent Application Publication No. 2005-116822, the p-type floating region is formed by injecting p-type impurities to a bottom surface of the outer peripheral trench after the outer peripheral trench is formed and then, by diffusing the injected p-type impurities in the semiconductor layer. However, depending on a material of the semiconductor and various conditions of other manufacturing processes, a diffusion distance of the p-type impurities might become short, and a width of each of the p-type floating regions might become smaller. In such a case, it is necessary to narrow the interval between the p-type floating regions in order to allow the depletion layer to sufficiently extend between the plurality of p-type floating regions. That is, the interval between the outer peripheral trenches needs to be narrowed. However, narrowing of the interval between the outer peripheral trenches is limited due to problems of accuracy of manufacturing processes and the like.

Therefore, in the semiconductor device disclosed herein, it is preferable that the plurality of loop trenches comprises loop trenches arranged along a first direction directed along the end surface when the semiconductor substrate is viewed from the front surface side, and loop trenches arranged along a second direction directed from the gate trench region to the end surface when the semiconductor substrate is viewed from the front surface side. Furthermore, it is preferable that the plurality of loop trenches comprises a first group, a second group, a third group and a fourth group, the first group comprises loop trenches arranged along the second direction, the second group comprises loop trenches arranged along the second direction and adjacent to the first group in the first direction, the third group comprises loop trenches arranged along the second direction and adjacent to the second group in the first direction, and the fourth group comprises loop trenches arranged along the second direction and adjacent to the third group in the first direction. Furthermore, it is preferable that each loop trench in the second and fourth groups is located at a position shifted along the second direction with respect to the adjacent loop trenches in the first and third groups.

Figure 16:
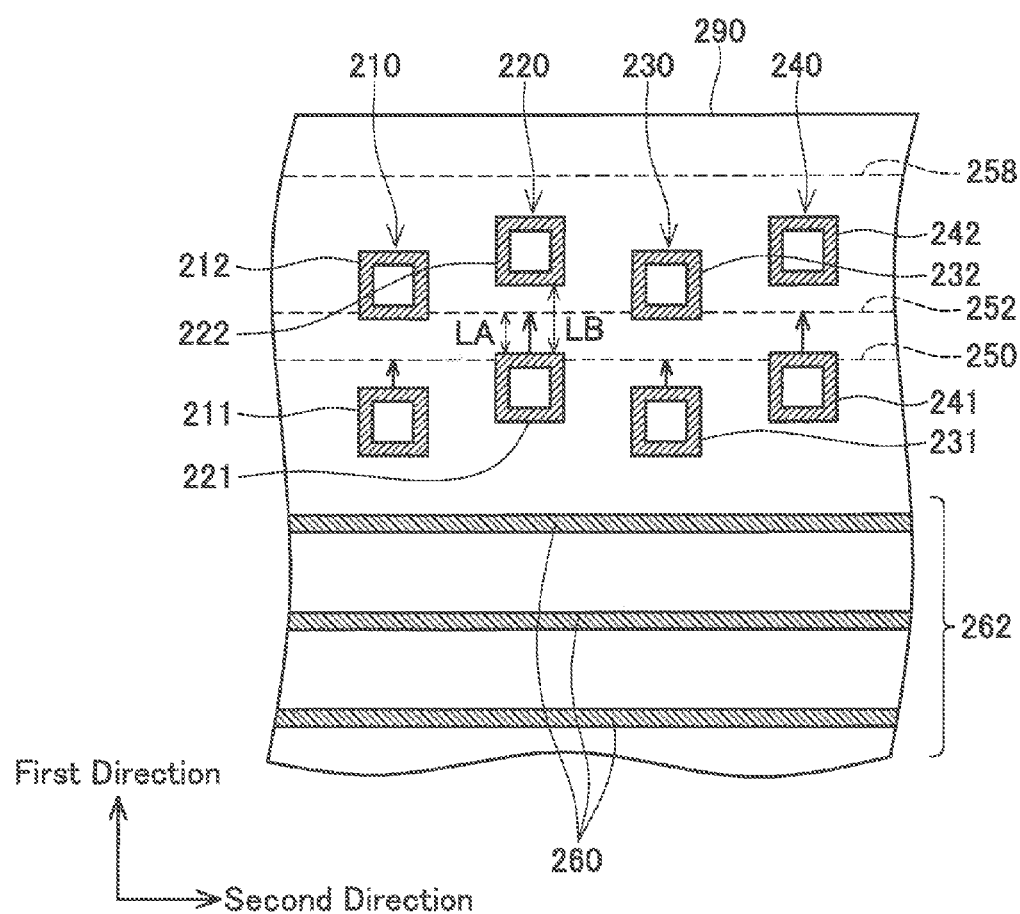
FIG. 16 is an upper view of a semiconductor device according to an example of the present description.

According to the configuration as above, the depletion layer can extend widely to the peripheral region even if an interval between the loop trenches is large. The following reason is considered to explain that. For example, as illustrated in FIG. 16, assume an instance in which a second group 220 and a fourth group 240 are shifted to an end surface 290 side more than a first group 210 and a third group 230. In this case, the depletion layer extending from a gate trench region 262 having a plurality of gate trenches 260 (that is, a region having a MOS structure) firstly reaches loop trenches 211 and 231 located on a closest side to a gate trench 262 side in the first group 210 and the third group 230. Then, the depletion layer extends from a fourth region (p-type region) located under the loop trenches 211 and 231 to its periphery. At this time, since the loop trench 211 and the loop trench 231 are arranged at an interval in a second direction, the depletion layer extends so that its interface is arranged along the end surface 290 of the semiconductor substrate as indicated by a dotted line 250. When the depletion layer extends as the dotted line 250, the depletion layer reaches the loop trenches 221 and 241 of the second group 220 and the fourth group 240. Thus, the depletion layer extends from the fourth region located under the loop trenches 221 and 241 to the periphery thereof and the depletion layer spreads to a position indicated by a dotted line 252 in FIG. 16. The depletion layer having spread to the dotted line 252 reaches loop trenches 212 and 232 in the first group 210 and the third group 230 and the depletion layer further extends from there to the periphery thereof. As a result, the depletion layer reaches loop trenches 222 and 242 in the second group 220 and the fourth group 240 and the depletion layer further extends from there to the periphery thereof. In this way, the depletion layer spreads to a position indicated by a dotted line 258. As described above, the depletion layer can easily spread since the second group 220 and the fourth group 240 are shifted. For example, even if a width LA of the depletion layer extending from the loop trenches 221 and 241 of the second group 220 and the fourth group 240 is smaller than an interval LB between each of the loop trenches in the first direction, the depletion layer can reach the loop trenches 212 and 232 in the first group 210 and the third group 230. Thus, even if the interval LB of the loop trenches is large, the depletion layer can be made to sufficiently extend.

Moreover, in the above-described semiconductor device, when the semiconductor substrate is viewed from the front surface side, at least one loop trench may have a rectangular shape comprising a side along the first direction and a side along the second direction, and include a protruding portion protruding outside from the rectangular shape along the side along the first direction.

According to the configuration as above, extension of the depletion layer in a direction in which the protruding portion extends (that is, the second direction) can be promoted by the protruding portion.

In the above-described semiconductor device, an extended line of the protruding portion preferably does not intersect with another loop trench adjacent to the loop trench including the protruding portion on a protruding portion side.

According to the configuration as above, the depletion layer can extend easily toward a region where there is no loop trench.

In the above-described semiconductor device, when the semiconductor substrate is viewed from the front surface side, at least one loop trench may have a rectangular shape comprising a side along the first direction and a side along the second direction. In this case, the side along the first direction may be longer than the side along the second direction. Moreover, when the semiconductor substrate is viewed from the front surface side, the fourth region being in contact with the bottom surface of the at least one loop trench may comprise a convex portion protruding outside from the rectangular shape along the side along the first direction.

According to the configuration as above, extension of the depletion layer in a direction in which the convex portion extends (that is, the first direction) can be promoted by the convex portion.

EMBODIMENT 1

Figure 1:
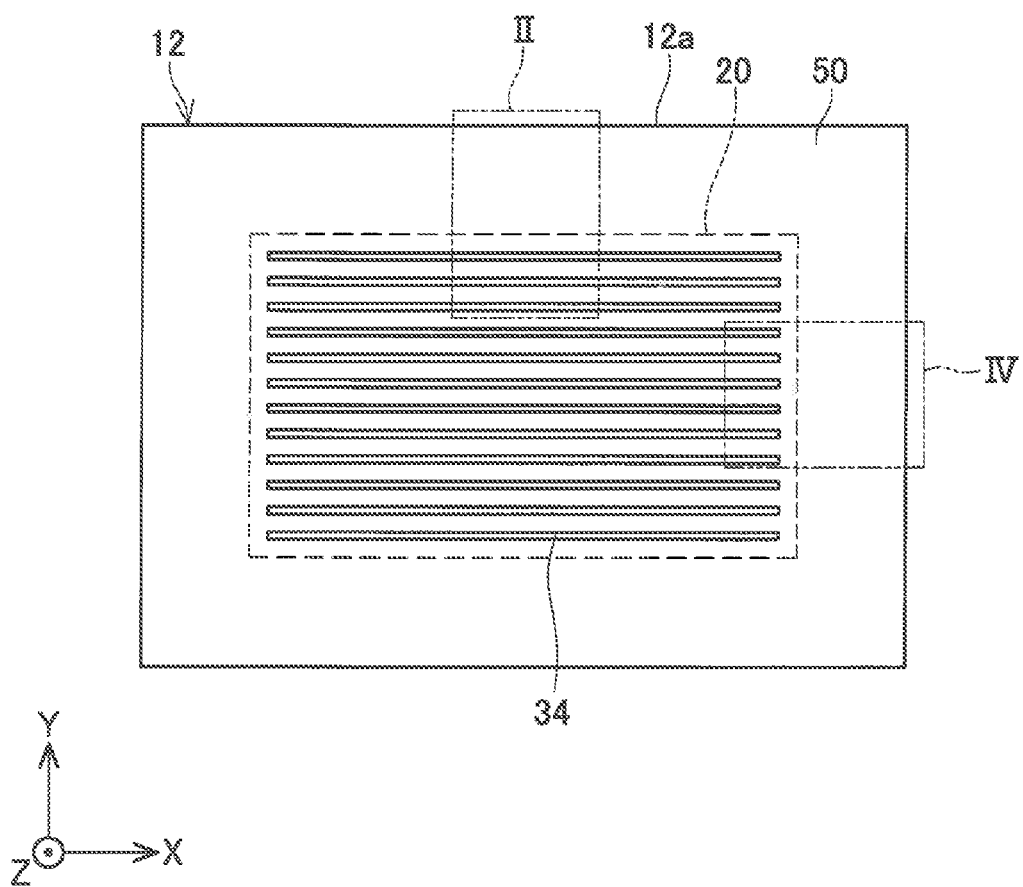
FIG. 1 is an upper view of a semiconductor device 10.

As illustrated in FIG. 1, a semiconductor device 10 according to Embodiment 1 has a semiconductor substrate 12 made of SiC. The semiconductor substrate 12 has a MOSFET region 20 and a peripheral region 50. A MOSFET is formed in the MOSFET region 20. It should be noted that only a gate trench 34 is illustrated in the MOSFET region 20 in FIG. 1 for ease of understanding of the drawing. Moreover, illustration of details in the peripheral region 50 is omitted in FIG. 1. The peripheral region 50 is a region between the MOSFET region 20 and an end surface 12a of the semiconductor substrate 12. It should be noted that, in each of the figures which will be explained below, an X-direction indicates a direction in which each of the gate trenches 34 extends (a longitudinal direction of the gate trenches 34) when an upper surface of the semiconductor substrate 12 is viewed on a plane, a Y-direction indicates a width direction of each of the gate trenches 34

(that is, a direction orthogonal to the X-direction) when the upper surface of the semiconductor substrate 12 is viewed on a plane, and a Z-direction indicates a thickness direction (a direction orthogonal to the X-direction and the Y-direction) of the semiconductor substrate 12.

As illustrated in FIGS. 2 to 5, source regions 22, body contact regions 24, a body region 26, a drift region 28, a drain region 30, p-type floating regions 32, the gate trenches 34, a source electrode 36, and a drain electrode 38 are formed in the MOSFET region 20.

The source regions 22 are formed in plural in the MOSFET region 20. The source regions 22 are n-type regions containing n-type impurities at high density. The source regions 22 are formed in ranges exposed to an upper surface of the semiconductor substrate 12.

The body contact regions 24 are p-type regions containing p-type impurities at high density. The body contact regions 24 are formed so as to expose on the upper surface of the semiconductor substrate 12 at a position where the source regions 22 are not formed.

The body region 26 is a p-type region containing the p-type impurities at low density. The p-type impurity density of the body region 26 is lower than the p-type impurity density of the body contact regions 24. The body region 26 is formed under the source regions 22 and the body contact regions 24 and is in contact with these regions.

The drift region 28 is an n-type region containing n-type impurities at low density. The n-type impurity density of the drift region 28 is lower than the n-type impurity density of the source region 22. The drift region 28 is formed under the body region 26. The drift region 28 is in contact with the body region 26 and is separated from the source region 22 by the body region 26.

The drain region 30 is an n-type region of n-type containing the n-type impurities at high density. The n-type impurity density of the drain region 30 is higher than the n-type impurity density of the drift region 28. The drain region 30 is formed under the drift region 28. The drain region 30 is in contact with the drift region 28 and is separated from the body region 26 by the drift region 28. The drain region 30 is formed in a range exposed to a lower surface of the semiconductor substrate 12.

The gate trenches 34 are formed in plural in the MOSFET region 20. The gate trenches 34 are grooves formed on an upper surface of the semiconductor substrate 12. Each of the gate trenches 34 is formed so as to penetrate the source region 22 and the body region 26 and to reach the drift region 28. The gate trenches 34 extend in parallel with each other along the X-direction. A bottom insulating layer 34a, a gate insulating film 34b, and a gate electrode 34c are formed in each of the gate trenches 34. The bottom insulating layer 34a is a thick insulating layer formed on a bottom portion of the gate trench 34. A side surface of the gate trench 34 above the bottom insulating layer 34a is covered by the gate insulating film 34b. The gate electrode 34c is formed in the gate trench 34 above the bottom insulating layer 34a. The gate electrode 34c is faced with the source region 22, the body region 26, and the drift region 28 via the gate insulating film 34b. The gate electrode 34c is insulated from the semiconductor substrate 12 by the gate insulating film 34b and the bottom insulating layer 34a. An upper surface of the gate electrode 34c is covered by the insulating layer 34d.

The p-type floating regions 32 are formed in the semiconductor substrate 12 and in ranges in contact with the bottom surfaces of the gate trenches 34. The periphery of each p-type floating region 32 is surrounded by the drift region 28. Each of the p-type floating regions 32 is separated from each other by the drift region 28.

The source electrode 36 is formed on the upper surface of the semiconductor substrate 12. The source electrode 36 is electrically conducted with the source region 22 and the body contact region 24.

The drain electrode 38 is formed on the lower surface of the semiconductor substrate 12. The drain electrode 38 is electrically conducted with the drain region 30.

Figure 2:
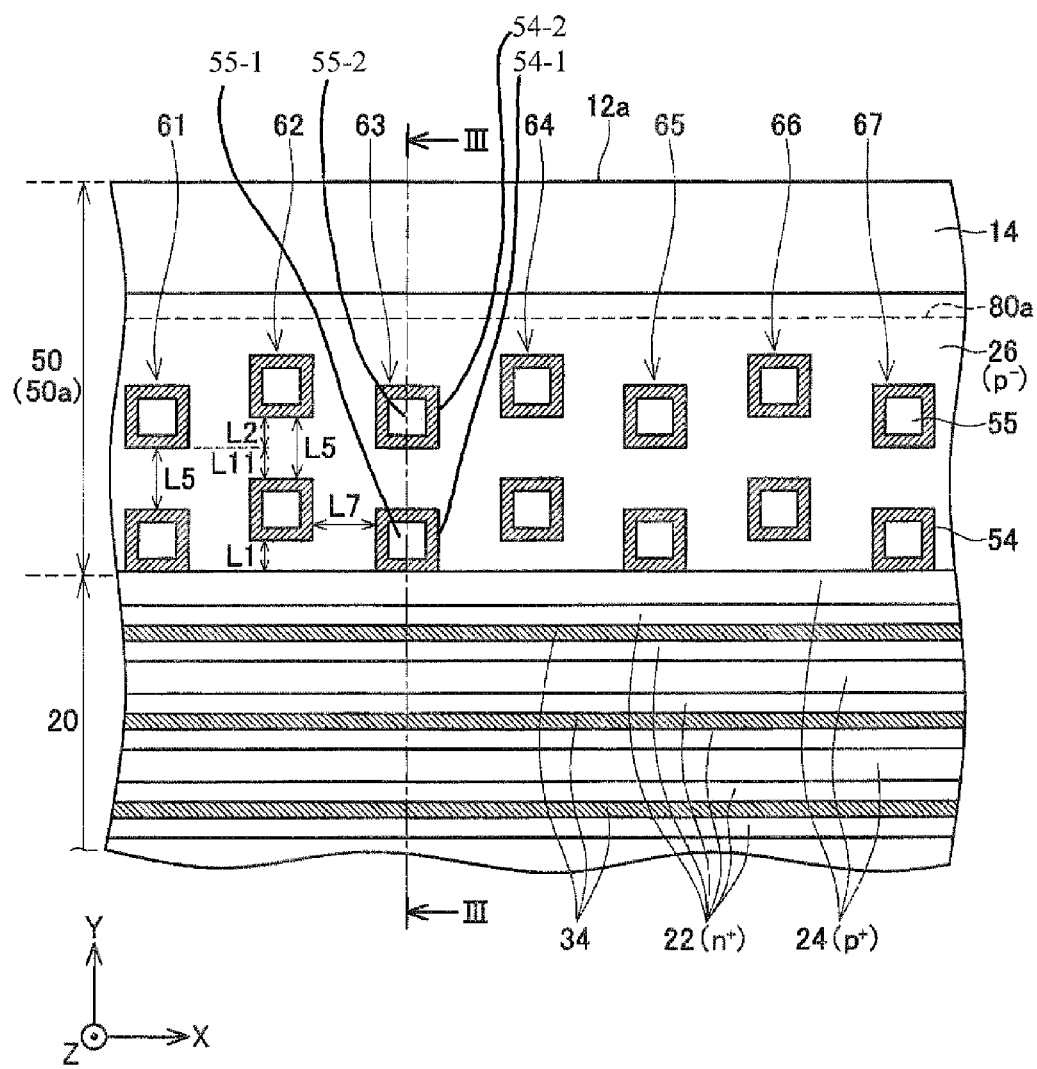
FIG. 2 is an enlarged view of a range II in FIG. 1 (view in which a source electrode 36 and insulating layers 34d and 52 are omitted)
Figure 3:
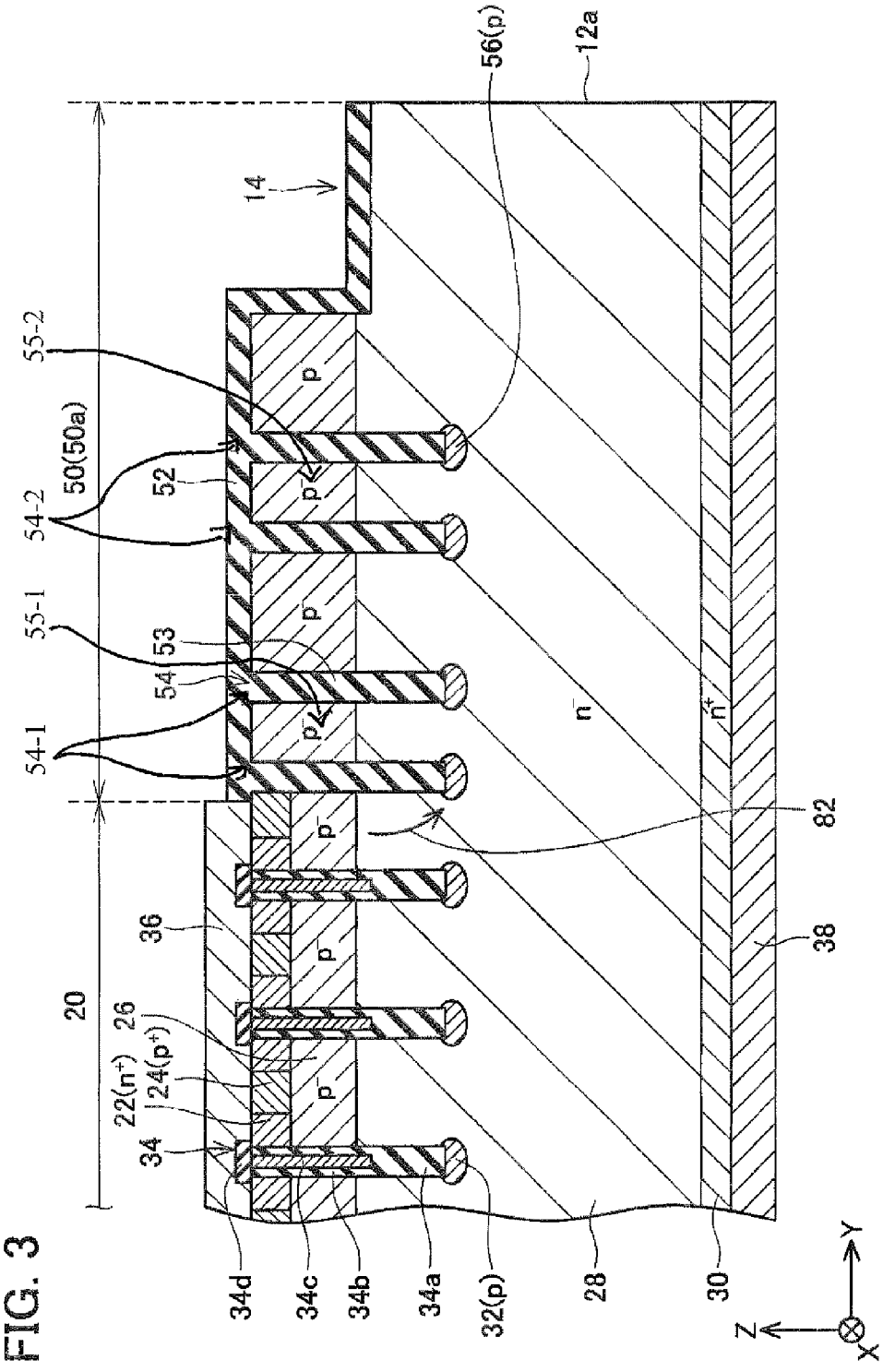
FIG. 3 is a longitudinal sectional view in III-III line in FIG. 2.
Figure 4:
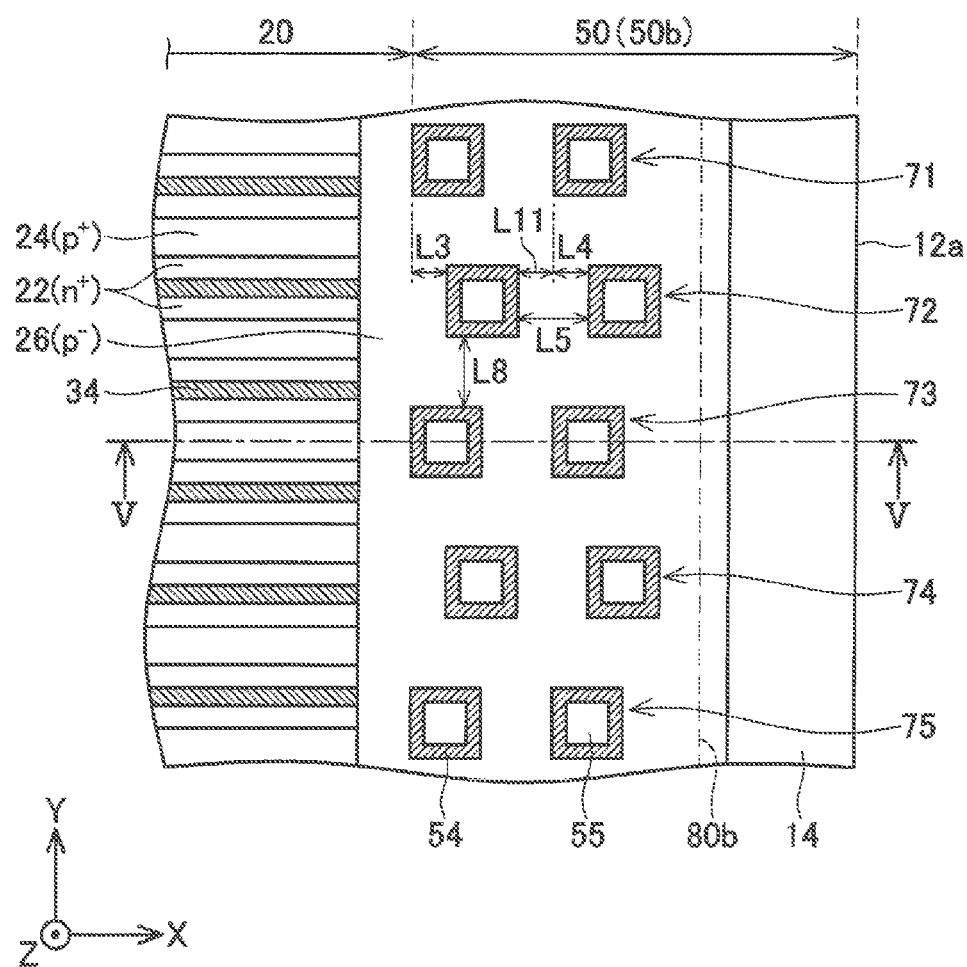
FIG. 4 is an enlarged view of a range IV in FIG. 1 (view in which the source electrode 36 and the insulating layers 34d and 52 are omitted)
Figure 5:
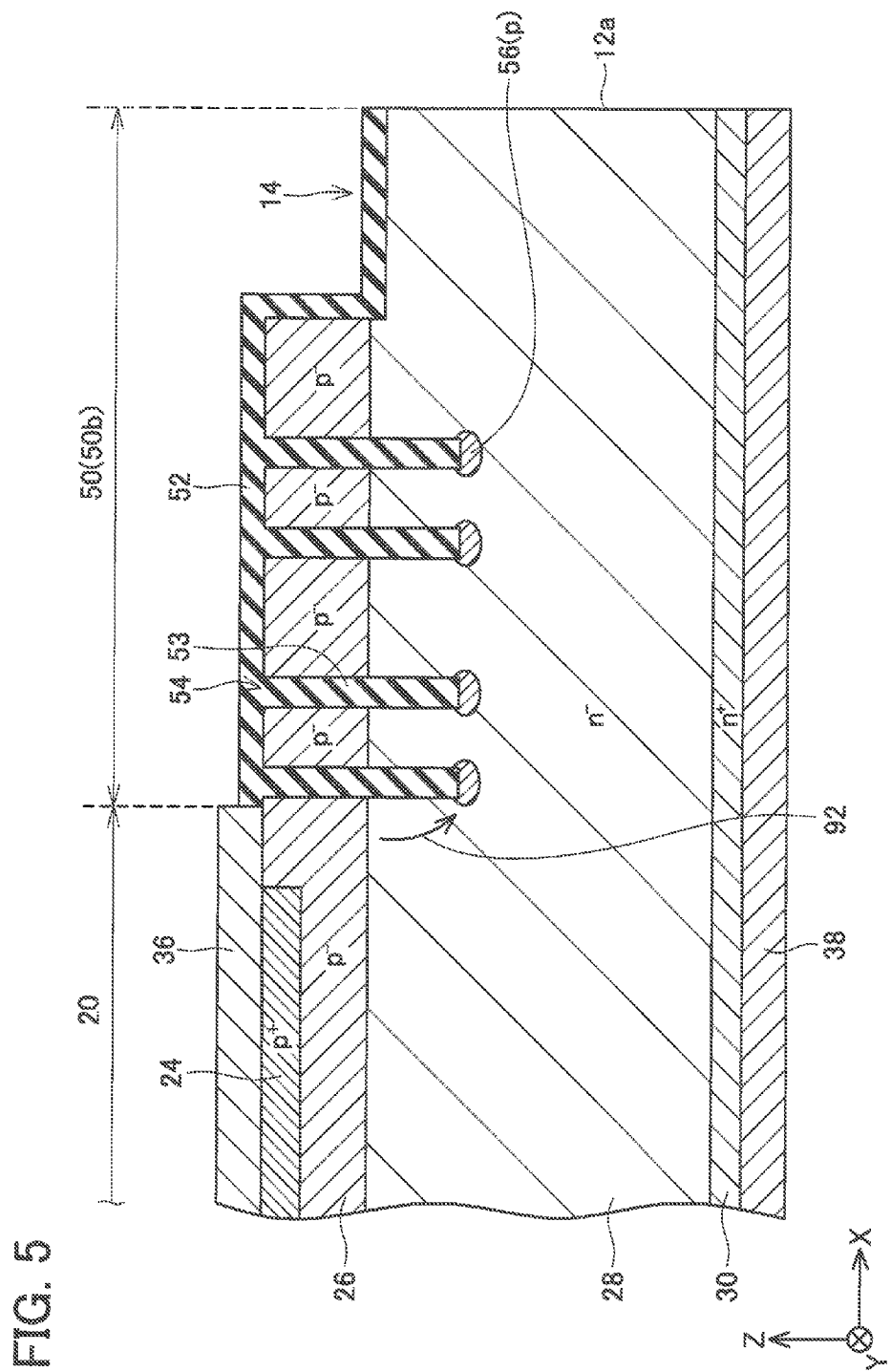
FIG. 5 is a longitudinal sectional view in V-V line in FIG. 4.

As illustrated in FIGS. 2 to 5, the above-described body region 26, the drift region 28, and the drain region 30 spread to the peripheral region 50. As illustrated in FIGS. 3 and 5, a step portion 14 is formed in the vicinity of the end surface 12a on the upper surface of the semiconductor substrate 12. The body region 26 extends to an end surface of the step portion 14. The drift region 28 and the drain region 30 extend to the end surface 12a of the semiconductor substrate 12. In the peripheral region 50, too, the body region 26, the drift region 28, and the drain region 30 are layered in this order. Moreover, the drain electrode 38 is formed on the whole lower surface of the semiconductor substrate 12 including the peripheral region 50. Moreover, the upper surface of the semiconductor substrate 12 in the peripheral region 50 is covered by an insulating layer 52.

A plurality of loop trenches 54 is formed on the upper surface of the semiconductor substrate 12 in the peripheral region 50. Each of the loop trenches 54 is formed so as to penetrate the body region 26 and to reach the drift region 28. Each of the loop trenches 54 is formed so as to have a rectangular shape having a side extending along the X-direction and a side extending along the Y-direction when the semiconductor substrate 12 is seen from above. An insulating layer 53 is filled in each of the loop trenches 54. Moreover, a p-type floating region 56 is formed in the semiconductor substrate 12 and in each of ranges in contact with a bottom surface of each of the loop trenches 54. The p-type floating region 56 is formed along the loop trench 54 so as to cover the entire bottom surface of the loop trench 54. Thus, the p-type floating region 56 is formed so as to have a loop rectangular shape overlapping the loop trench 54 when the semiconductor substrate 12 is seen from above. Each of the p-type floating regions 56 is separated from each other by the drift region 28.

FIG. 2 illustrates arrangement of the loop trenches 54 in a first peripheral region 50a adjacent to the MOSFET region 20 in the Y-direction. In the first peripheral region 50a, the X-direction is a direction along the end surface 12a of the semiconductor substrate 12, and the Y-direction is a direction from the MOSFET region 20 (that is, the gate trench region) toward the end surface 12a of the semiconductor substrate 12. As illustrated in FIG. 2, the loop trenches 54 are arranged in plural in the X-direction and the Y-direction in the first peripheral region 50a. Hereinafter, the plurality of loop trenches 54 juxtaposed in the Y-direction in the first peripheral region 50a will be referred to as a group. FIG. 2 illustrates groups 61 to 67 of the loop trenches 54. Each of the groups 61 to 67 has two loop trenches 54. Positions of the groups 61, 63, 65, and 67 in the Y-direction substantially coincide with each other. That is, the positions of the loop trenches 54 located on the MOSFET region 20 side of the groups 61, 63, 65, and 67 substantially coincide with each other in the Y-direction, and the positions of the loop trenches 54 located on the end surface 12a side of these groups substantially coincide with each other in the Y-direction. Moreover, the positions of the groups 62, 64, and 66 in the Y-direction substantially coincide with each other. That is, the positions of the loop trenches 54 located on the MOSFET region 20 sides of the groups 62, 64, and 66 substantially coincide with each other in the Y-direction, and the positions of the loop trenches 54 located on the end surface 12*a* side of these groups substantially coincide with each other in the Y-direction. Moreover, the positions of the groups 62, 64, and 66 are shifted in the Y direction (on the end surface 12*a* side) with respect to the groups 61, 63, 65, and 67. That is, the loop trenches located on the MOSFET region 20 sides of the groups 62, 64, and 66 are shifted in the Y-direction (on the end surface 12*a* side) only by a distance L1 with respect to the loop trenches 54 located on the MOSFET region 20 sides of the groups 61, 63, 65, and 67. Moreover, the loop trenches located on the end surface 12*a* sides of the groups 62, 64, and 66 are shifted in the Y-direction (on the end surface 12*a* side) only by a distance L2 with respect to the loop trenches 54 located on the end surface 12*a* sides of the groups 61, 63, 65, and 67. ID other words, in the first peripheral region 50*a*, the plurality of loop trenches 54 are arranged in a houndstooth pattern. It should be noted that, in Embodiment 1, the distance L1 is equal to the distance L2, bat the distance L1 might be different from the distance L2.

FIG. 4 illustrates arrangement of the loop trenches 54 in a second peripheral region 50*b* adjacent to the MOSFET region 20 in the X-direction. In the second peripheral region 50*b*, the Y-direction is a direction along the end surface 12*a* of the semiconductor substrate 12, and the X-direction is a direction from the MOSFET region 20 (that is, the gate trench region) toward the end surface 12*a* of the semiconductor substrate 12. As illustrated in FIG. 4, the loop trenches 54 are arranged in plural in the X-direction and the Y-direction in the second peripheral region 50*b*. Hereinafter, the plurality of loop trenches 54 juxtaposed in the X-direction in the second peripheral region 50*b* will be referred to as a group. FIG. 4 illustrates groups 71 to 75 of the loop trenches 54. Each of the groups 71 to 75 has two loop trenches 54. Positions of the groups 71, 73, and 75 in the X-direction substantially coincide with each other. That is, the positions of the loop trenches 54 located on the MOSFET region 20 sides in the groups 71, 73, and 75 substantially coincide with each other in the X-direction, and the positions of the loop trenches 54 located on the end surface 12*a* side in these groups substantially coincide with each other in the X-direction. Moreover, the positions of the groups 72, and 74 in the X-direction substantially coincide with each other. That is, the positions of the loop trenches 54 located on the MOSFET region 20 sides in the groups 72 and 74 substantially coincide with each other in the X-direction, and the positions of the loop trenches 54 located on the end surface 12*a* side in these groups substantially coincide with each other in the X-direction. Moreover, the positions of the groups 72 and 74 are shifted in the X direction (on the end surface 12*a* side) with respect to the groups 71, 73, and 75. That is, the loop trenches 54 located on the MOSFET region 20 sides in the groups 72 and 74 are shifted in the X-direction (on the end surface 12*a* side) only by a distance L3 with respect to the loop trenches 54 located on the MOSFET region 20 sides in the groups 71, 73, and 75. Moreover, the loop trenches 54 located on the end surface 12*a* sides in the groups 72 and 74 are shifted in the X-direction (on the end surface 12*a* side) only by a distance L4 with respect to the loop trenches 54 located on the end surface 12*a* sides in the groups 71, 73, and 75. In other words, in the second peripheral region 50*b*, the plurality of loop trenches 54 is arranged in a houndstooth pattern. It should be noted that, in Embodiment 1, the distance L3 is equal to the distance L4, but the distance L3 may be different from the distance L4.

Subsequently, an operation of the semiconductor device 10 will be explained. When the semiconductor device 10 is to be operated, a voltage which causes the drain electrode 38 to be positive is applied between the drain electrode 38 and the source electrode 36. Moreover, by applying a gate-on voltage to the gate electrodes 34*c*, the MOSFET in the MOSFET region 20 is turned on. That is, a channel is formed in the body region 26 at a position faced with each gate electrode 34*c*, and an electric current flows from the source electrode 36 toward the drain electrode 38 through the source regions 22, the channels, the drift region 28, and the drain region 30. When the application of the gate-on voltage to the gate electrodes 34*c* is stopped, the channels disappear, and the MOSFET is turned off. When the MOSFET is turned off, the depletion layer spreads into the drift region 28 from a pn junction on a boundary portion between the body region 26 and the drift region 28. When the depletion layer reaches the p-type floating regions 32 in the MOSFET region 20, the depletion layer spreads also into the drift region 28 from the p-type floating regions 32. As a result, the drift region 28 between the two p-type floating regions 32 is effectively depleted. Thus, concentration of electric field in the MOSFET region 20 is suppressed. As a result, a high withstand voltage is realized in the MOSFET region 20.

Moreover, the depletion layer extending from the above-described pn junction also reaches the p-type floating regions 56 under the loop trenches 54 located on the side the closest to the MOSFET region 20 as indicated by an arrow 82 in FIG. 3 and an arrow 92 in FIG. 5. Then, the depletion layer spreads into the drift region 28 from those p-type floating regions 56, and the depletion layer reaches the adjacent p-type floating regions 56. How the depletion layer spreads in the peripheral region 50 will be described in detail later, but as the depletion layer sequentially extends from one p-type floating region 56 to other adjacent p-type floating regions 56, the depletion layer widely extends into the peripheral region 50. As a result, a high withstand voltage is realized also in the peripheral region 50.

Figure 6:
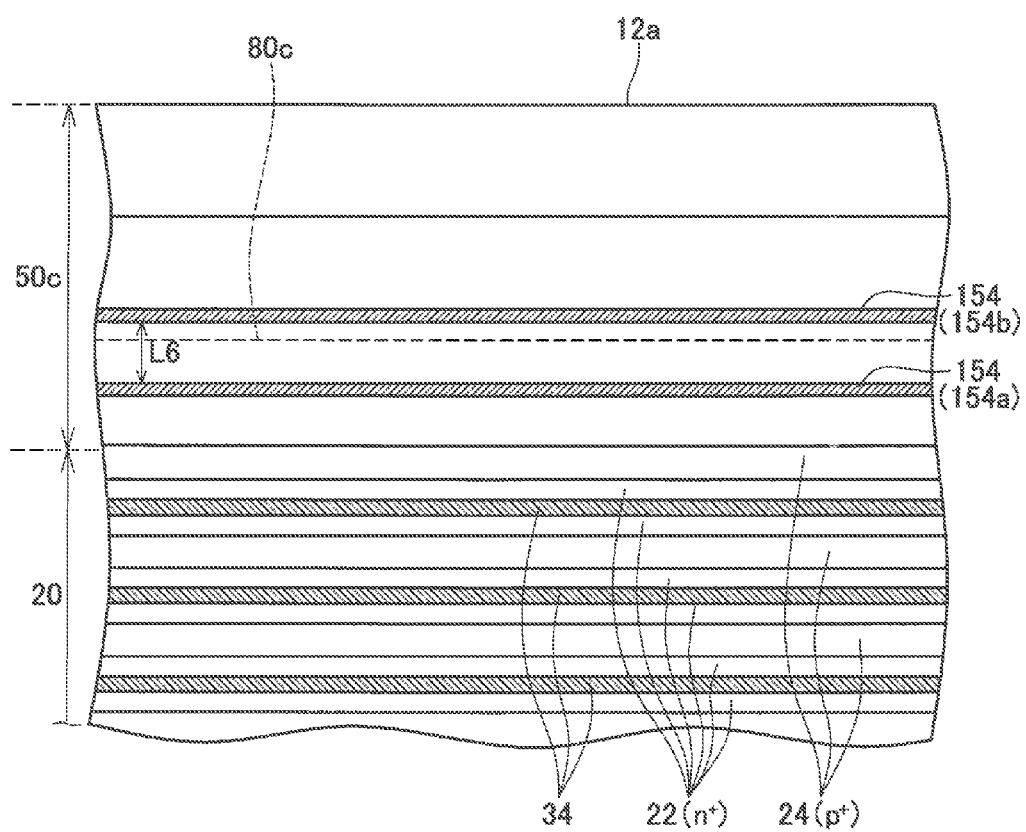
FIG. 6 is an enlarged view of a peripheral region 50c of a prior-art semiconductor device.

Dotted lines 80*a* and 80*b* in FIGS. 2 and 4 indicate positions of an end portion of the depletion layer extending to the drift region 28 of the peripheral region 50 from the MOSFET region 20. That is, it means that the depletion layer spreads in the drift region 28 on the MOSFET region 20 side of the dotted lines 80*a* and 80*b*. The dotted lines 80*a* and 80*b* indicate results obtained by simulations. Moreover, FIG. 6 illustrates a result of simulation on an extension distance of the depletion layer in the peripheral region 50*c* of a prior-art structure (that is, a peripheral region in which a plurality of trenches 154 extending in parallel with the end surface 12*a* of the semiconductor substrate 12 is formed). A dotted line 80*c* in FIG. 6 indicates a position of the end portion of the depletion layer. It should be noted that, in the semiconductor device in FIG. 6, a sectional structure of each of the trenches 154 is similar to that according to Embodiment 1, and the p-type floating region is formed along the bottom surface of each of the trenches 154. Moreover, in any one of simulations in FIGS. 2, 4, and 6, the voltage applied to the MOSFET was assumed to be set the same. Moreover, a distance L5 between the loop trenches 54 in FIGS. 2 and 4 is equal to a distance L6 between the trenches 154 in FIG. 6. As illustrated in FIGS. 2 and 4, in the semiconductor device 10 in Embodiment 1, the depletion layer extends beyond the region in which the loop trench 54 group is formed from the MOSFET region 20 to a vicinity of the step portion 14. On the other hand, in the prior-art structure, extension of the depletion layer stops between the two trenches 154, and the depletion layer does not reach the trench 154*b* on the outer side. Thus, the end portion of the depletion layer is located between the trench 154*a* and the trench 154*b* as indicated by the dotted line 80*c*. With such configuration, it is difficult to obtain a sufficient withstand voltage in the peripheral region 50c. As is obvious from comparison of FIGS. 2 and 4 with FIG. 6, since the depletion layer sufficiently extends in the peripheral region 50 in Embodiment 1, a high withstand voltage can be obtained.

Figure 7:
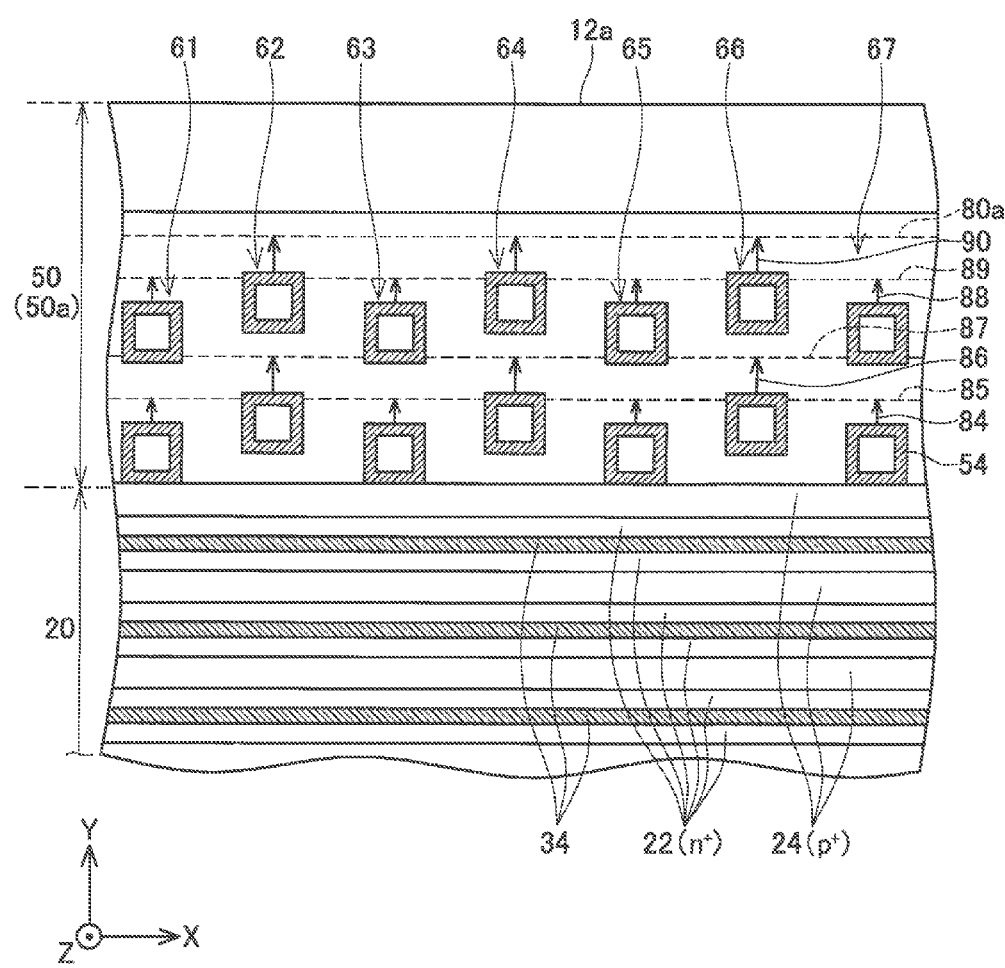
FIG. 7 is an explanatory view for extension of a depletion layer in the range II in FIG. 1.

The reason why the high withstand voltage can be obtained in the peripheral region 50 of Embodiment 1 is considered to be as follows. As described above, in the first peripheral region 50a, the depletion layer having extended from the pn junction in the MOSFET region 20 reaches the loop trenches 54 on the side the closest to the MOSFET region 20 as indicated by the arrow 82 in FIG. 3. Then, the depletion layer spreads into the drift region 28 of the first peripheral region 50a from the p-type floating regions 56 under those loop trenches 54. FIG. 7 is an explanatory view illustrating a state of the extension of the depletion layer in the first peripheral region 50a. First, the depletion layer reaches the loop trenches 54 on the MOSFET region 20 sides of the groups 61, 63, 65, and 67. As illustrated in FIG. 7, since the loop trenches 54 on the side the closest to the MOSFET region 20 are arranged in plural at intervals in the X-direction in the peripheral region 50a, the depletion layer extends substantially uniformly in the Y-direction as indicated by arrows 84 and the dotted line 85 in FIG. 7 from the p-type floating regions 56 located under these loop trenches 54. The depletion layer having extended as indicated by the dotted line 85 reaches the loop trenches 54 on the MOSFET region 20 sides of the groups 62, 64, and 66. Thus, the depletion layer spreads into the drift region 28 from the p-type floating regions 56 located under these loop trenches 54. Since these loop trenches 54 are also arranged at intervals in the X-direction, the depletion layer extend substantially uniformly in the Y-direction as indicated by arrows 86 and a dotted line 87 in FIG. 7 from the p-type floating regions 56 located under these loop trenches 54. The depletion layer having extended as indicated by the dotted line 87 reaches the loop trenches 54 on the end surface 12a sides of the groups 61, 63, 65, and 67. Thus, the depletion layer spreads into the drift region 28 from the p-type floating regions 56 located under these loop trenches 54. That is, as indicated by arrows 88 and a dotted line 89 in FIG. 7, the depletion layer extends substantially uniformly in the Y-direction. The depletion layer having extended as indicated by the dotted line 89 reaches the loop trenches 54 on the end surface 12a sides of the groups 62, 64, and 66. Thus, the depletion layer spreads into the drift region 28 from the p-type floating regions 56 located under these loop trenches 54. That is, as indicated by arrows 90 and the dotted line 80a in FIG. 7, the depletion layer extends substantially uniformly in the Y-direction. Therefore, in the peripheral region 50a, the depletion layer spreads to the position indicated by the dotted line 80a.

Figure 8:
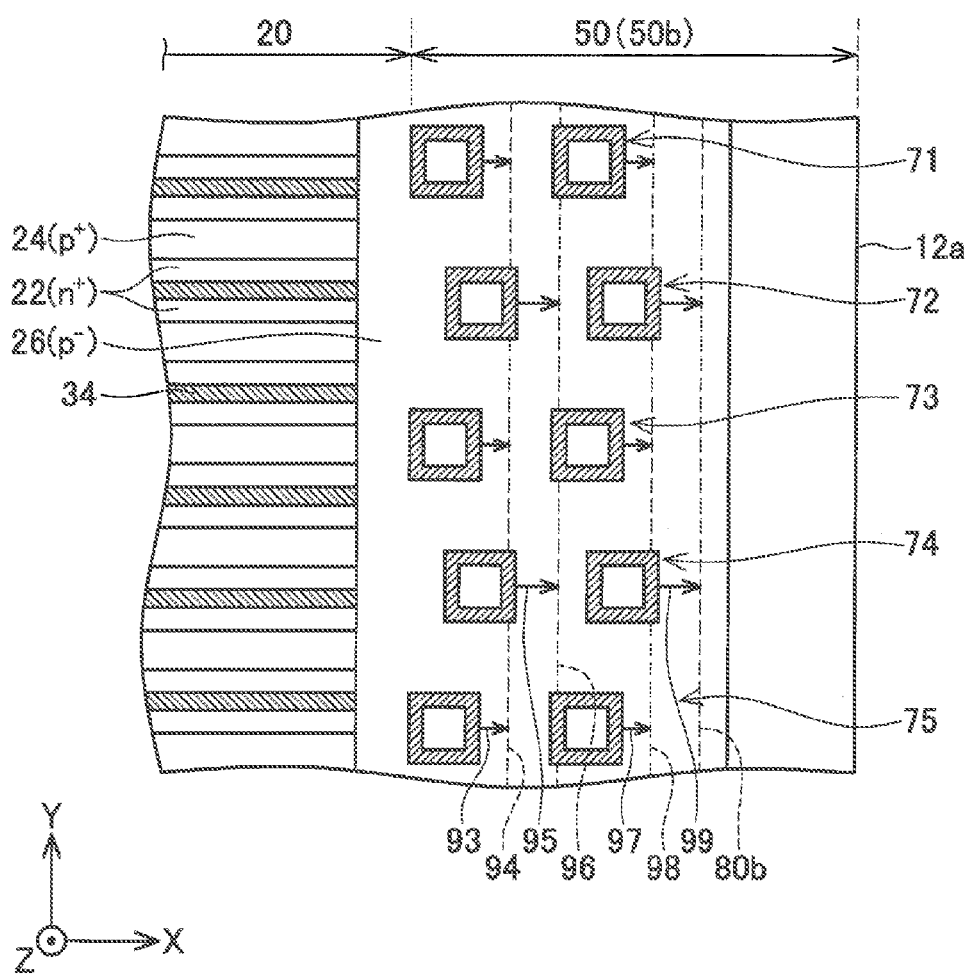
FIG. 8 is an explanatory view for extension of the depletion layer in the range IV in FIG. 1.

Moreover, in the second peripheral region 50b, as indicated by the arrow 92 in FIG. 5, the depletion layer having extended from the pn junction in the MOSFET region 20 reaches the loop trenches 54 on the closest side to the MOSFET region 20. Then, the depletion layer spreads into the drift region 28 of the second peripheral region 50b from the p-type floating regions 56 located under those loop trenches 54. FIG. 8 is an explanatory view illustrating a state of extension of the depletion layer in the second peripheral region 50b. First, the depletion layer reaches the loop trenches 54 on the MOSFET region 20 sides of the groups 71, 73, and 75. As illustrated in FIG. 8, since the loop trenches 54 on the closest side to the MOSFET region 20 are arranged in plural at intervals in the Y-direction in the peripheral region 50a, the depletion layer extends substantially uniformly in the X-direction from the p-type floating regions 56 located under these loop trenches 54 as indicted by arrows 93 and a dotted line 94 in FIG. 8. The depletion layer having extended as indicated by the dotted line 94 reaches the loop trenches 54 on the MOSFET region 20 sides of the groups 72 and 74. Thus, the depletion layer spreads into the drift region 28 from the p-type floating regions 56 located under these loop trenches 54. Since these loop trenches 54 are also arranged at intervals in the Y-direction, the depletion layer extends substantially uniformly in the X-direction from the p-type floating regions 56 located under these loop trenches 54 as indicated by arrows 95 and a dotted line 96 in FIG. 8. The depletion layer having extended as indicated by the dotted line 96 reaches the loop trenches 54 on the end surface 12a sides of the groups 71, 73, and 75. Thus, the depletion layer spreads into the drift region 28 from the p-type floating regions 56 located under these loop trenches 54. That is, as indicated by arrows 97 and a dotted line 98 in FIG. 8, the depletion layer extends substantially uniformly in the X-direction. The depletion layer having extended as indicated by the dotted line 98 reaches the loop trenches 54 on the end surface 12a sides of the groups 72 and 74. Thus, the depletion layer spreads into the drift region 28 from the p-type floating regions 56 located under these loop trenches 54. That is, the depletion layer extends substantially uniformly in the X-direction as indicated by arrows 99 and the dotted line 80b in FIG. 8. Therefore, the depletion layer spreads to the position indicated by the dotted line 80b in the second peripheral region 50b.

As described above, in the semiconductor device 10 in Embodiment 1, it is possible for the depletion layer to sufficiently extend in the peripheral region 50 even if the interval between the loop trenches 54 is large. Thus, the semiconductor device 10 can be easily manufactured and also has a high withstand voltage.

It should be noted that, in the first peripheral region 50a, an interval L7 between the loop trenches 54 adjacent in the X-direction (see FIG. 2) is also large. However, the depletion layer extends from the p-type floating regions 56 on the both sides to a portion indicated by the interval L7. Thus, even if the interval L7 is large, the portion indicated by the interval L7 is depleted. Moreover, in the second peripheral region 50b, an interval L8 between the loop trenches 54 adjacent in the Y-direction (see FIG. 4) is also large. However, the depletion layer extends from the p-type floating regions 56 on the both sides to a portion indicated by the interval L8. Thus, even if the interval L8 is large, the portion indicated by the interval L8 is depleted.

Moreover, a region 55 (see FIGS. 2 and 4) surrounded by the loop trench 54 is surrounded also by the p-type floating region 56. Thus, little potential difference is generated in the region 55. Therefore, the drift region 28 in the region 55 does not necessarily have to be depleted. Even if the drift region 28 in the region 55 is not depleted, the withstand voltage is not affected. Two loop trenches 54-1 and 54-2 are on the III-II line in FIG. 2. The two loop trenches 54-1 and 54-2 are also shown in FIG. 3 (the sectional view along III-III line). In FIG. 3, one loop trench 54-1 is illustrated as two separate trenches and another loop trench 54-2 is illustrated as two separate trenches. The region 55-1 is surrounded by the loop trench 54-1 and the region 55-2 is surrounded by the loop trench 54-2. The loop trenches 54-1 and 54-2 (inside of the loop trenches 54 themselves, not the surrounded regions 55) are filled with insulating layer 53 as shown in FIG. 3. The region 55-1 and 55-2 are not filled with the insulating layer 53. The regions 55-1 and 55-2 are semiconductor layers (semiconductor substrate).

Moreover, according to the configuration of Embodiment 1, a size of each of the loop trenches is small. Therefore, even in the case of a temperature rise of the semiconductor device or the like, thermal stress generated in the loop trench is small. Therefore, this semiconductor device has high reliability.

EMBODIMENT 2

Figure 9:
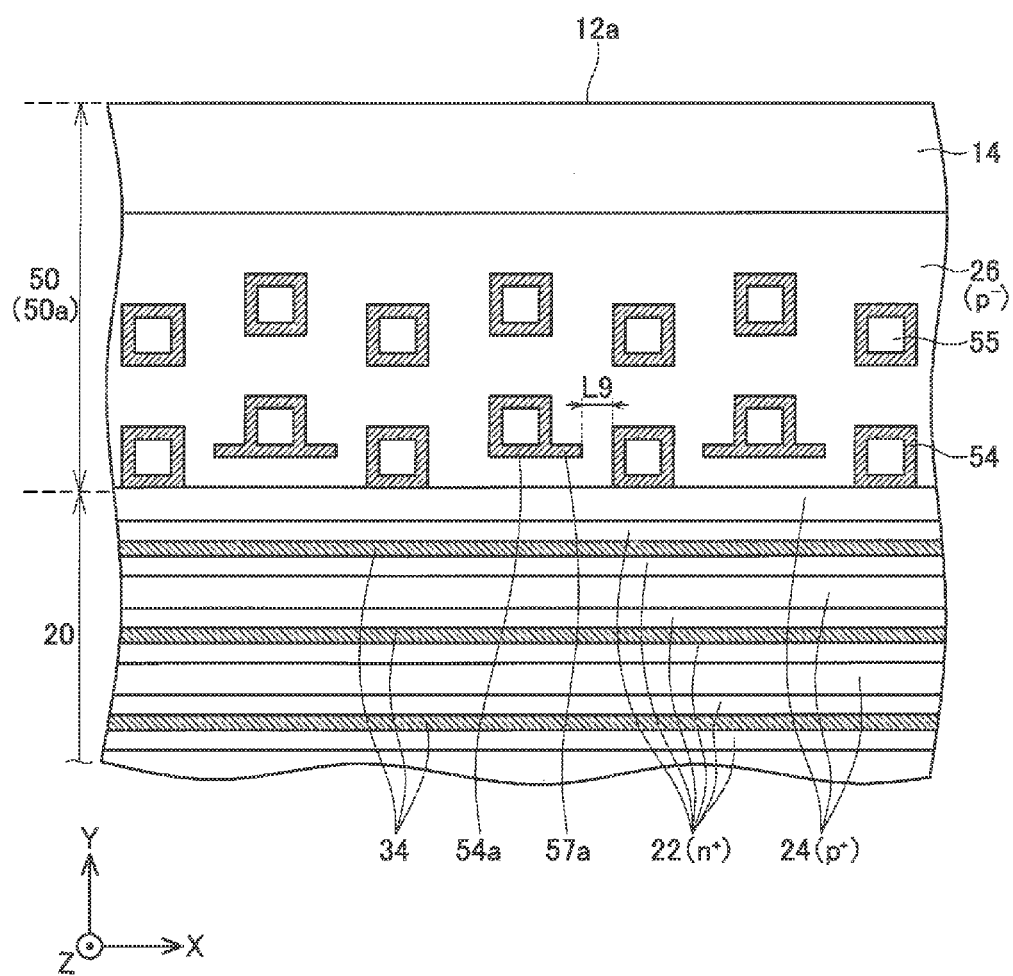
FIG. 9 is an enlarged view corresponding to FIG. 2 of a semiconductor device of Embodiment 2.

In a semiconductor device in Embodiment 2, as illustrated in FIG. 9, one or more loop trenches 54a in the first peripheral region 50a have protruding portions 57a protruding outward from rectangles along sides extending in the X-direction, respectively. The protruding portion 57a extends toward the adjacent loop trench 54. Thus, an interval L9 between the adjacent loop trench 54 and the protruding portion 57a is narrowed. It should be noted that, since the p-type floating region 56 is formed along the loop trench 54, the p-type floating region 56 is formed also under the trench constituting the protruding portion 57a.

According to such configuration, extension of the depletion layer in the X-direction from the loop trench 54a is promoted by the p-type floating region 56 located under the protruding portion 57a. As a result, the depletion layer can be made to reliably extend to a portion indicated by the interval L9. Moreover, though the interval L9 is narrowed by the protruding portion 57a, if such a portion with a narrowed interval is local, trenches can be formed with relatively high accuracy. Thus, no problem on working accuracy occurs even if the protruding portion 57a is provided.

Figure 10:
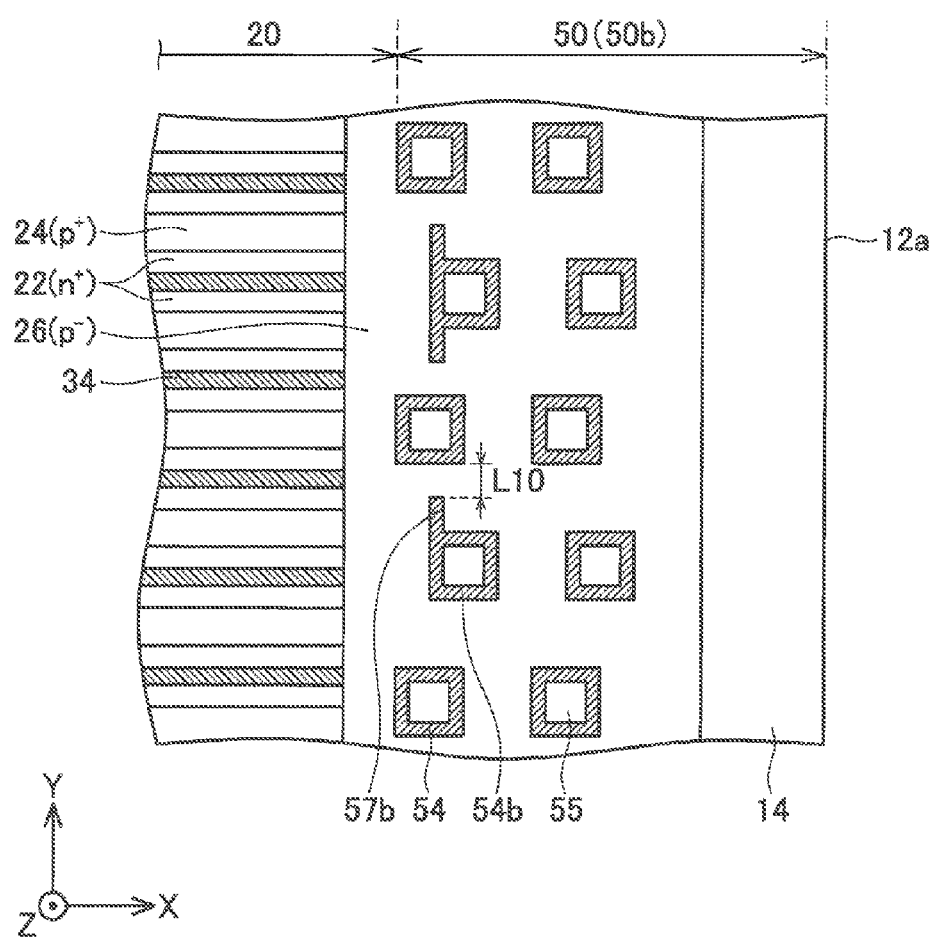
FIG. 10 is an enlarged view corresponding to FIG. 4 of the semiconductor device of Embodiment 2.

Moreover, in the semiconductor device in Embodiment 2, as illustrated in FIG. 10, one or more loop trenches 54b in the second peripheral region 50b have protruding portions 57b protruding outward from rectangles along sides extending in the Y-direction, respectively. The p-type floating region 56 is formed under the trench constituting the protruding portion 57b. By such configuration, the depletion layer can be made to extend more reliably to a portion indicated by an interval L10.

EMBODIMENT 3

Figure 11:
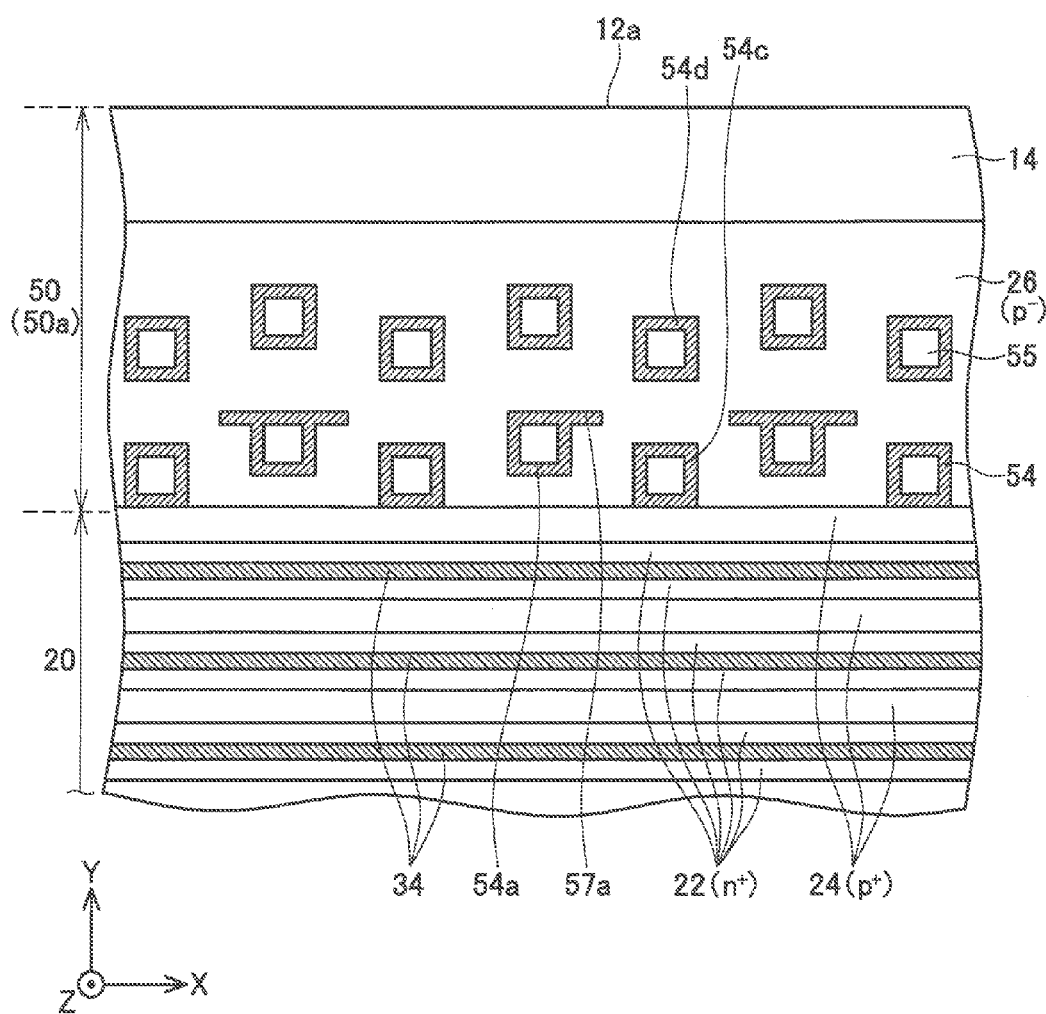
FIG. 11 is an enlarged view corresponding to FIG. 2 of a semiconductor device of Embodiment 3.

In a semiconductor device in Embodiment 3, as illustrated in FIG. 11, the protruding portion 57a of the loop trench 54a extends toward a region between two loop trenches 54c and 54d of the adjacent groups in the first peripheral region 50a. That is, an extended line of the protruding portion 57a does not intersect the adjacent loop trenches 54c. Since a region surrounded by the loop trenches 54a, 54c, and 54d is far from any of the loop trenches 54, this is a region in which the depletion layer cannot extend easily. Since the protruding portion 57a extends toward such region, according to the configuration of Embodiment 3, the depletion layer can be made to extend into the first peripheral region 50a more reliably.

Figure 12:
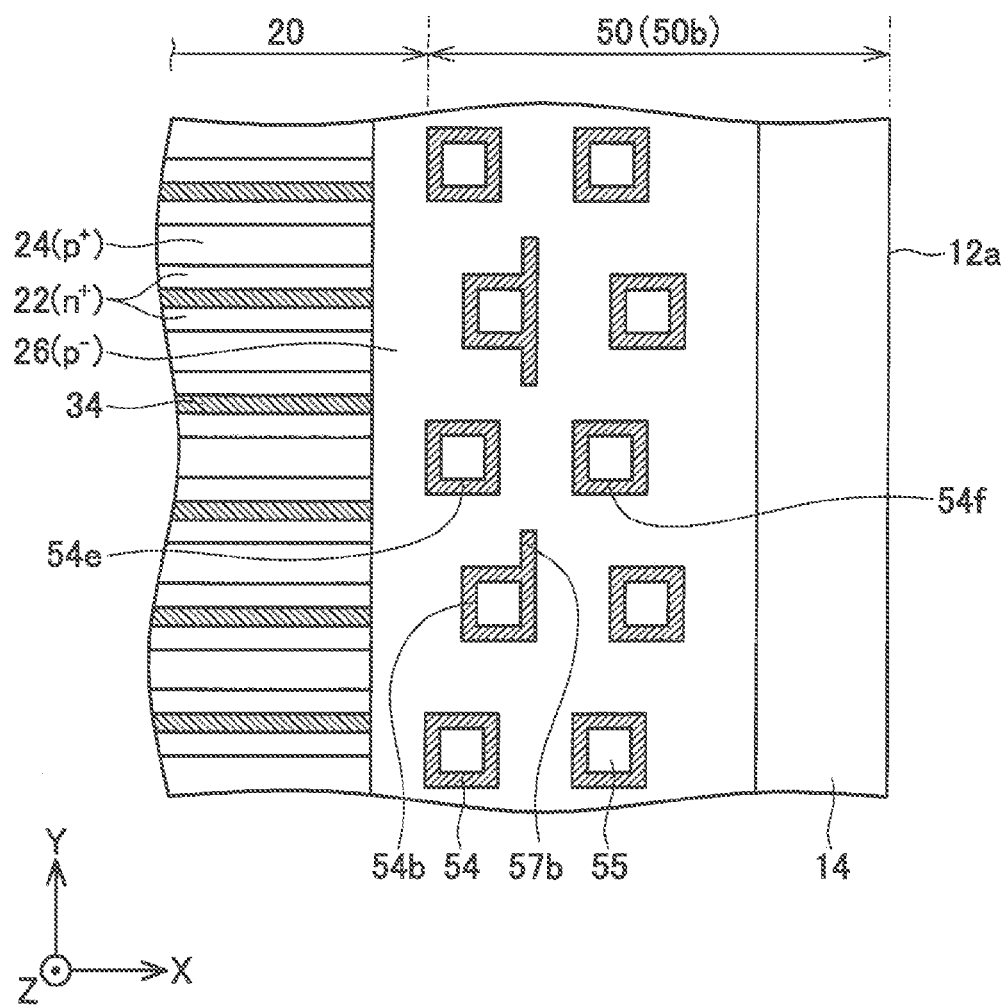
FIG. 12 is an enlarged view corresponding to FIG. 4 of the semiconductor device of Embodiment 3.

Moreover, in the semiconductor device in Embodiment 3, as illustrated in FIG. 12, the protruding portion 57b of the loop trench 54b extends toward a region between two loop trenches 54e and 54f of the adjacent groups in the second peripheral region 50b. As described above, since the protruding portion 57b extends toward a region in which the depletion layer cannot extend easily, according to the configuration of Embodiment 3, the depletion layer can be made to extend into the second peripheral region 50b more reliably.

EMBODIMENT 4

Figure 13:
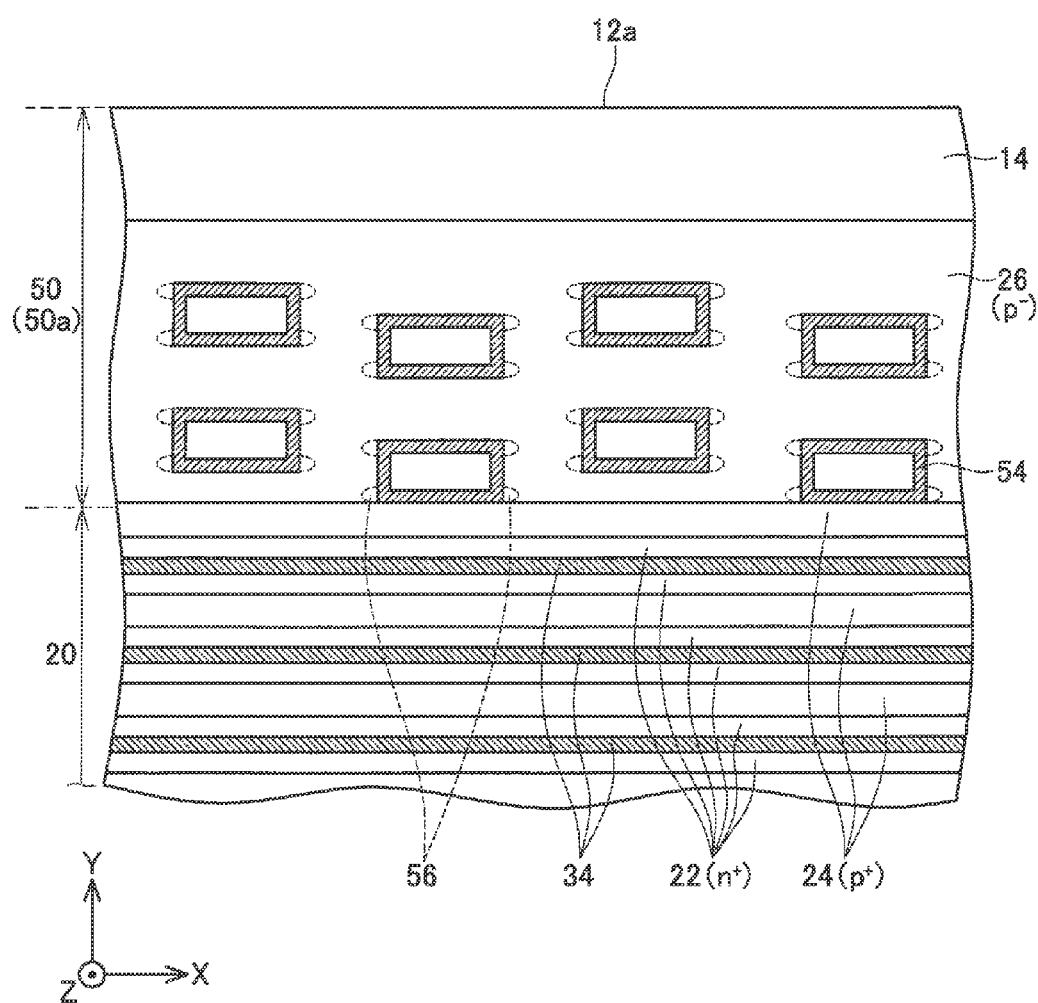
FIG. 13 is an enlarged view corresponding to FIG. 2 of a semiconductor device of Embodiment 4.

In a semiconductor device in Embodiment 4, as illustrated in FIG. 13, each of the loop trenches 54 in the first peripheral region 50a has a rectangular shape elongated in the X-direction when the semiconductor substrate 12 is seen from the upper surface side. Moreover, in this semiconductor device, the p-type floating regions 56 partially protrude from the rectangle of each loop trench 54 outward in the X-direction as indicated by a dotted line in FIG. 13. The p-type floating regions 56 protrude in the X-direction at corner portions of the loop trenches 54. The p-type floating regions 56 protruding as such are formed by inclining the injection direction along the X-direction (a long side direction of the rectangles) when the p-type impurities are injected to the bottom surfaces of the loop trenches 54. As described above, by injecting the impurities diagonally with respect to the bottom surface of each trench, the p-type floating regions 56 partially protruding in the X-direction from each loop trench 54 can be formed. As described above, by providing the p-type floating regions 56 protruding in the X-direction, extension of the depletion layer in the X-direction can be further promoted.

Figure 14:
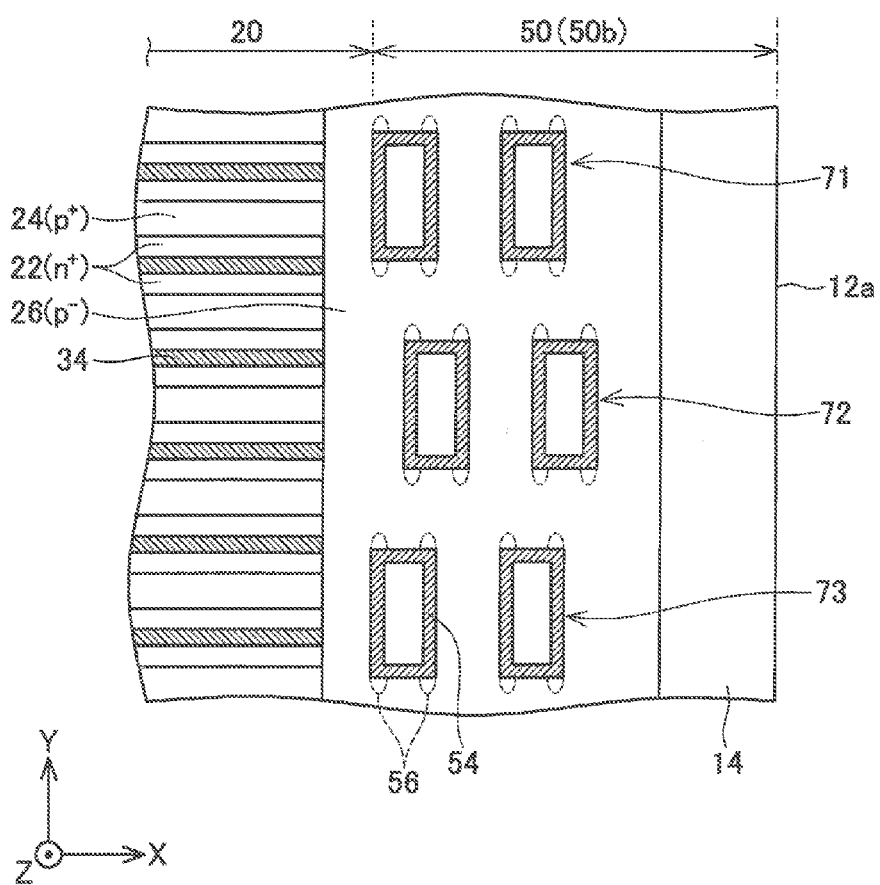
FIG. 14 is an enlarged view corresponding to FIG. 4 of e semiconductor device of Embodiment 4.

Moreover, in the semiconductor device in Embodiment 4, as illustrated in FIG. 14, the loop trenches 54 in the second peripheral region 50b have a rectangular shape elongated in the Y-direction when the semiconductor substrate 12 is seen from the upper surface side. Moreover, as indicated by a dotted line in FIG. 14, the p-type floating regions 56 partially protrude from the rectangles of the loop trenches 54 outward in the Y-direction. The p-type floating regions 56 protruding as above can be provided by diagonal injection of impurities with respect to the trenches. By providing the p-type floating regions 56 protruding in the Y-direction, extension of the depletion layer in the Y-direction can be further promoted.

It should be noted that the configurations in Embodiments 1 to 4 can be employed regardless of a material of the semiconductor substrate but they are particularly useful if a material with a short diffusion distance of impurities such as SiC, diamond or the like is used. The reason for that will be explained below. In general, the p-type floating regions in the peripheral region are formed as below. First, trenches are formed on the upper surface of the semiconductor substrate in the peripheral region. Subsequently, the p-type impurities are injected to the bottom surfaces of the trenches. Subsequently, the injected p-type impurities are made to diffuse in the semiconductor layer by heat treatment or the like. As a result, the p-type floating regions are formed. If SiC or diamond is used, the injected p-type impurities are not diffused much in the lateral direction of the semiconductor substrate. Thus, the depletion layer cannot be extended sufficiently in the peripheral region as illustrated in FIG. 6, for example, unless the interval between the p-type floating regions (that is, the interval between trenches) is narrowed. On the other hand, narrowing of the interval between the trenches is limited due to the problem of working accuracy of the manufacturing process. According to the configurations of Embodiments 1 to 4, since it is possible to sufficiently extend the depletion layer in the peripheral region 50 even if the interval between the loop trenches 54 is large, such problem can be solved.

It should be noted that a distance L11 in FIGS. 2 and 4 is a distance required for the depletion layer extending from the loop trenches 54 to reach the other loop trenches 54. Therefore, in Embodiments 1 to 4, the distance L11 is preferably set shorter than the distance by which the depletion layer extends. A distance W by which the depletion layer extends can be expressed by the following equation:

$$W = ([2\epsilon/q][Na+Nd/NaNd]Vbi)^{-1/2}$$

where Na is donor density, Nd is acceptor density, and Vbi is a built-in potential. Therefore, the above-described distance L11 is preferably set to L11<W.

Figure 15:
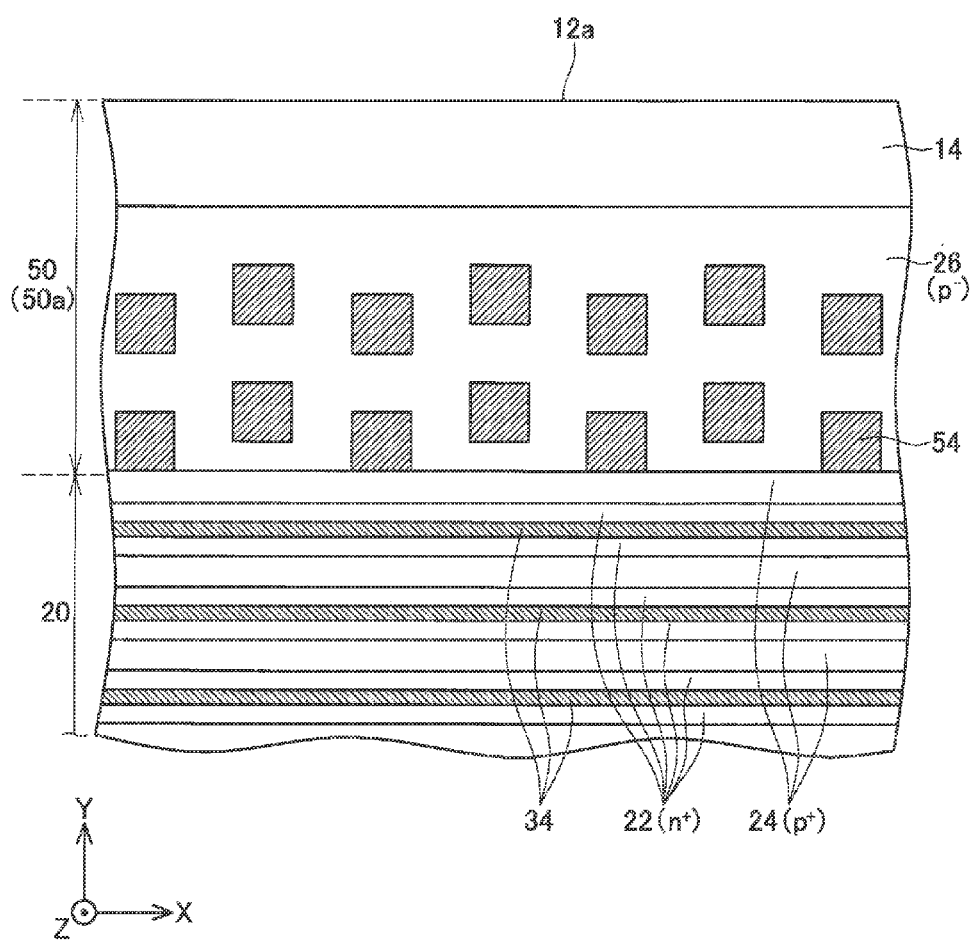
FIG. 15 is an enlarged view corresponding to FIG. 4 of a semiconductor device of a reference example.

It should be noted that, in the above-described Embodiments 1 to 4, each of the loop trenches 54 has a rectangular shape when the semiconductor substrate 12 is seen from the upper surface side. However, each of the loop trenches 54 may be formed having a circular shape, an oval shape or any other shapes when the semiconductor substrate 12 is seen from the upper surface side. Moreover, in the above-described embodiments 1 to 4, the region 55 inside the loop trench 54 may be filled by an insulating layer. That is, as illustrated in FIG. 15, it may be so configured that the entire rectangular region is a trench and the insulating layer is filled in the trench. The p-type floating region can be formed so as to cover the entire bottom surface of the insulating layer (that is, the trench). With such configuration, too, the depletion layer can be effectively extended to the peripheral region 50.

Moreover, in the above-described Embodiments, the insulating layer is filled in the entire trench of the peripheral region, but some of the trenches may have electrodes embedded in the insulating layers or the like.

Moreover, in the above-described Embodiments, each group has two loop trenches but the number of loop trenches that each group has may be three or more. Moreover, the number of the loop trenches each group has may be different from each other.

Specific examples of the present invention were explained above in detail, but they are merely exemplifications and do not limit the range of claims. The technologies described in the appended claims include various modifications and variations of the specific examples exemplified above.

The technical elements explained in the description or the drawings exert technical usability singularly or in various combinations and should not be limited to the combinations described in claims at filing. Moreover, the technologies exemplified in the description or the drawings achieve the plurality of objects at the same time and achievement itself of any one of those objects has technical usability.

The invention claimed is:

1. A semiconductor device comprising a semiconductor substrate,
   wherein
   an n-type first region is formed in the semiconductor substrate, the first region is formed in a range exposed to a front surface of the semiconductor substrate;
   a p-type second region is formed in the semiconductor substrate, the second region is formed in a range exposed to the front surface and in a range located under the first region, the second region is in contact with the first region;
   an n-type third region is formed in the semiconductor substrate, the third region is formed in a range located under the second region, the third region is in contact with the second region, and the third region is separated from the first region by the second region;
   a plurality of gate trenches is formed on the front surface, the plurality of gate trenches is configured to penetrate the first and second regions and reach the third region;
   a first insulating layer and a gate electrode are formed in each gate trench, the gate electrode is configured to face the second region via the first insulating layer;
   a plurality of loop trenches is formed in a peripheral region of the front surface, the peripheral region is located between a gate trench region in which the plurality of gate trenches is formed and an end surface of the semiconductor substrate, the plurality of loop trenches is configured to penetrate the second region and reach the third region;
   each loop trench is configured, when the semiconductor substrate is viewed from a front surface side, to extend so as to surround a region smaller than the gate trench region;
   each loop trench is separated from other loop trenches;
   a second insulating layer is located in each loop trench; and
   a plurality of p-type fourth regions is formed in the semiconductor substrate, each fourth region is in contact with a bottom surface of corresponding one of the loop trenches, and each fourth region is configured to extend along the corresponding one of the loop trenches.

2. A semiconductor device of claim 1, wherein
   the plurality of loop trenches comprises loop trenches arranged along a first direction directed along the end surface when the semiconductor substrate is viewed from the front surface side, and loop trenches arranged along a second direction directed from the gate trench region to the end surface when the semiconductor substrate is viewed from the front surface side,
   the plurality of loop trenches comprises a first group, a second group, a third group and a fourth group, the first group comprises loop trenches arranged along the second direction, the second group comprises loop trenches arranged along the second direction and adjacent to the first group in the first direction, the third group comprises loop trenches arranged along the second direction and adjacent to the second group in the first direction, and the fourth group comprises loop trenches arranged along the second direction and adjacent to the third group in the first direction, and
   each loop trench in the second and fourth groups is located at a position shifted along the second direction with respect to the adjacent loop trenches in the first and third groups.

3. A semiconductor device of claim 2, wherein
   when the semiconductor substrate is viewed from the front surface side, at least one loop trench has a rectangular shape comprising a side along the first direction and a side along the second direction, and includes a protruding portion protruding outside from the rectangular shape along the side along the first direction.

4. A semiconductor device of claim 3, wherein
   an extended line of the protruding portion does not intersect with another loop trench adjacent to the loop trench including the protruding portion on a protruding portion side.

5. A semiconductor device of claim 2, wherein
   when the semiconductor substrate is viewed from the front surface side, at least one loop trench has a rectangular shape comprising a side along the first direction and a side along the second direction,
   the side along the first direction is longer than the side along the second direction, and
   when the semiconductor substrate is viewed from the front surface side, the fourth region being in contact with the bottom surface of the at least one loop trench comprises a convex portion protruding outside from the rectangular shape along the side along the first direction.

6. A semiconductor device comprising a semiconductor substrate,
   wherein
   an n-type first region is formed in the semiconductor substrate, the first region is formed in a range exposed to a front surface of the semiconductor substrate;
   a p-type second region is formed in the semiconductor substrate, the second region is formed in a range exposed to the front surface and in a range located under the first region, the second region is in contact with the first region;

an n-type third region is formed in the semiconductor substrate, the third region is formed in a range located under the second region, the third region is in contact with the second region, and the third region is separated from the first region by the second region;

a plurality of gate trenches is formed on the front surface, the plurality of gate trenches is configured to penetrate the first and second regions and reach the third region;

a first insulating layer and a gate electrode are formed in each gate trench, the gate electrode is configured to face the second region via the first insulating layer;

a plurality of loop trenches is formed in a peripheral region of the front surface, the peripheral region is located between a gate trench region in which the plurality of gate trenches is formed and an end surface of the semiconductor substrate, the plurality of loop trenches is configured to penetrate the second region and reach the third region;

each loop trench, when the semiconductor substrate is viewed from a front surface side, defines an area that is smaller than an entire area of the gate trench region;

each loop trench is separated from other loop trenches;

a second insulating layer is located in each loop trench; and a plurality of p-type fourth regions is formed in the semiconductor substrate, each fourth region is in contact with a bottom surface of corresponding one of the loop trenches, and each fourth region is configured to extend along the corresponding one of the loop trenches.

* * * * *